United States Patent [19]
Boos et al.

[11] Patent Number: 5,798,540
[45] Date of Patent: Aug. 25, 1998

[54] ELECTRONIC DEVICES WITH INALASSB/ALSB BARRIER

[75] Inventors: John Bradley Boos, Springfield; Walter Kruppa, Fairfax, both of Va.; Doewon Park, Greenbelt, Md.; Brian R. Bennett, Alexandria, Va.

[73] Assignee: The United States of America as represented by the Secretary of the Navy, Washington, D.C.

[21] Appl. No.: 848,203

[22] Filed: Apr. 29, 1997

[51] Int. Cl.$^6$ ................................ H01L 29/00
[52] U.S. Cl. .................. 257/194; 257/200; 257/201; 257/280
[58] Field of Search ................... 257/194, 200, 257/201, 280

[56] References Cited

U.S. PATENT DOCUMENTS

| | | | |
|---|---|---|---|
| 4,695,857 | 9/1987 | Baba et al. | 257/194 |
| 5,364,816 | 11/1994 | Boos et al. | 257/276 |
| 5,453,627 | 9/1995 | Aihara et al. | 257/194 |

*Primary Examiner*—Valencia Wallace
*Attorney, Agent, or Firm*—Thomas McDonnell; George Kap

[57] ABSTRACT

An electronic device characterized by a GaAs substrate and a base disposed on the substrate, the base comprising InAs channel layer, AlSb layer above the channel layer, $In_xAl_{1-x}As_ySb_{1-y}$ layer containing at least In, Al, and As disposed above the AlSb channel layer, InAs cap layer disposed above and in contact with the $In_xAl_{1-x}As_ySb_{1-y}$ layer disposed below the InAs channel layer and in contact with the substrate, $p^+$ GaSb layer disposed within the AlSb layer, Schottky gate with a pad disposed on and in contact with the $In_xAl_{1-x}As_ySb_{1-y}$ layer, at least one ohmic contact disposed on the InAs cap layer, and a trench extending through the base to the substrate isolating the gate bonding pad from the device and providing a gate air bridge which prevents contact between the gate and the InAs layer. The gate air bridge fabrication is accomplished by a liquid etchant containing more than half, on volume basis, of concentrated lactic acid or acetic acid with remainder hydrogen peroxide and concentrated hydrofluoric acid. The etchant attacks InAs, $In_xAl_{1-x}As_ySb_{1-y}$, AlSb, and GaSb but does not attack GaAs and Au-based alloys.

12 Claims, 3 Drawing Sheets

$L_G$ = 0.1 μm, $L_{SD}$ = 2.3 μm, W = 28 μm

1

ELECTRONIC DEVICES WITH INALASSB/ ALSB BARRIER

BACKGROUND OF THE INVENTION

1. Field of the Invention

The field of this invention is electronic devices characterized by high frequency performance, fabrication of the electronic devices, and an etchant used in the fabrication of the electronic devices.

2. Background Art

Future generations of microwave and millimeter-wave radar, communications, electronic warfare, smart weapons, and imaging systems will require higher precision, smaller size, increased bandwidth, lower operating voltages, and lower cost of production. To meet the demand for improved high-frequency performance, considerable effort within the past ten years has focused on the development of GaAs-based and InP-based high-electron-mobility transistors (HEMTs). As a result, a variety of HEMT circuits have been fabricated which operate at higher frequencies, have wider bandwidths, and have improved power, efficiency, gain, and noise figure performance. The primary factors responsible for the improved HEMT performance have been the increase in the In mole fraction in the $In_xGa_{1-x}As$ channel and the increase in the conduction band offset at the 2DEG interface. As a result of these improvements, InP-based HEMTs have distinct millimeter-wave performance advantages compared to GaAs-based HEMTs, and currently hold the record in frequency response and noise figure for any three-terminal semiconductor device.

In the longer term, AlSb/InAs-based HEMTs may be more attractive than InP-based HEMTs for some of the above applications due to the substantially improved material properties of this heterojunction system. Higher electron mobility and higher electron velocity can be achieved with an InAs channel compared to an $In_xGa_{1-x}As$ channel. The lower electron effective mass of InAs gives this material system a advantage in the room-temperature mobility which can be achieved for a given HEMT sheet charge density. Due to the large Γ-L valley separation, InAs also has a higher electron peak velocity compared to the other semiconductors. The considerably larger conduction band discontinuity at the donor layer/channel interface enables the formation of deeper quantum well and the associate benefits of a larger 2DEG sheet charge density, superior carrier confinement, and improved modulation efficiency.

In addition to the increased high-frequency performance potential, InAs-channel HEMTs are also attractive for applications requiring low voltage operation. The higher electron mobility and velocity, and reduced access resistance enable the attainment of higher effective velocity at a significantly lower drain voltage.

Although improvements have been made in recent years, the material growth and fabrication technology for AlSb/InAs heterojunction field effect transistors (HFETs) is relatively immature. The high reactivity of AlSb-related materials, the small valence-band offset of the AlSb/InAs heterojunction, and the increased impact ionization in the InAs channel due to its narrow bandgap increase the complexity of the material growth and device design requirements.

AlSb/InAs-based HFETs have previously been fabricated with barrier layers which include AlSb, AlGaSb, AlSbAs, AlGaSbAs, and a superlattice consisting of AlSb/AlAs. Each of these approaches has advantages and disadvantages relating to growth complexity, stability, conduction band and valence band offset, and insulator effectiveness. Typically, the insulating quality of the thin barrier layer is relatively poor which causes AlSb/InAs-based HEMTs to suffer from high gate leakage current. The lack of a barrier layer with sufficient insulating quality and stability has been a considerable drawback which has limited the performance and usefulness of AlSb/InAs-based HEMTs.

Due to the high Al content, most AlSb-based barrier layer materials also are reactive in air and therefore must be capped with a more stable layer to prevent oxidation. To cap the barrier layer, AlSb/InAs-based HFETs have commonly utilized a single cap layer of GaSb or GaAsSb, or a double cap layer design using $Al_{0.8}Ga_{0.2}Sb/GaSb$, GaSb/$In_{0.8}Ga_{0.2}As$ or GaSb/InAs. The reactivity of the barrier layer has restricted the use of a gate recess etch through the cap layer prior to the deposition of the gate metallization. An optimized gate recess etch can significantly increase performance and is a central feature in the design and fabrication of most GaAs- and InP-based HEMTs.

Optimization of the buffer layer is also a necessary design requirement to properly manage the significant number of holes generated by impact ionization in the channel. Most AlSb/InAs-based HEMTs reported thus far suffer from undesirable trapping of the additional holes generated which results in a "kink effect" in the drain characteristics.

As in the case of InP-based HEMTs, the fabrication of the AlSb/InAs-based HEMTs also requires that the gate metal be prevented from contacting the narrow band gap channel as it traverses the mesa edge to eliminate what would otherwise be a source of significant gate leakage current. The conventional fabrication approach which addresses this issue for InP-based HEMTs in not easily transferable to the fabrication of AlSb/InAs-based HEMTs due to the high reactivity of AlSb- and GaSb-based materials and the requirement that the gate bonding pad in the field must be located on a chemically-stable surface.

SUMMARY OF THE INVENTION

An object of this invention is an electronic device using the AlSb/InAs-based material system comprising a first, a second, and third layers of semiconducting material, the first layer being of a narrower bandgap material than that of the second layer, the third layer being disposed between and in contact with the first and the second layers, and a Schottky barrier gate metal disposed and being in contact with the second layer.

Another object of this invention is an electronic device characterized by a composite barrier above the channel layer and a doped GaSb layer disposed in the buffer layer below the channel layer.

Another object of this invention is fabrication of an electronic device characterized by a Schottky barrier disposed on a stable composite barrier material.

Another object of this invention is fabrication of an electronic device characterized by isolation thereof by the use of an etchant that can etch the semiconducting materials but not GaAs or Au-containing materials.

These and other objects of this invention are accomplished by providing in a high frequency electronic device, a composite barrier layer above the channel layer, a doped $p^+$ layer within a buffer layer below the channel layer, an air bridge between a gate and the channel layer, and the use of an etchant in the isolation process which does not attack GaAs or a Au-containing alloy.

DESCRIPTION OF PREFERRED EMBODIMENTS

A semiconductor electronic device is described herein which can operate at high frequencies exceeding 100 GHz. The parameters which characterize the high frequency performance include noise figure, short-circuit current gain, maximum available gain, and efficiency.

The semiconductor device of this invention can be fabricated in a manner that is conventional for such devices with the exception of the isolation process which is carried out with a novel etchant which can etch InAs, $In_xAl_{1-x}As_ySb_{1-y}$, AlSb, and doped GaSb but not GaAs or a Au-containing metal alloy.

The device contemplated herein is any semiconductor device characterized by the presence of narrow band gap semiconductor material, wide band gap semiconductor material, and a Schottky metal gate disposed on and being in contact with the wide band gap material. In a preferred embodiment, the device can be a field effect transistor, a diode or a sensor.

Suitable semiconductor materials are selected from Groups III–V semiconductor elements of the Periodic Table such as indium, aluminum, gallium, arsenic, antimony, phosphorus, and the like. Sb-based semiconductors for device applications are also suitable herein particularly for their unique electronic and optoelectronic properties. This includes the use of wide and narrow band gap materials. Examples of wide band gap materials include InPSb, AlPSb, InAlAs, InAlAsSb, and AlGaAsSb. Examples of narrow band gap materials include InAs, GaSb and InSb. Of special interest herein is a semiconductor device wherein the buffer layer is AlSb, the barrier layers are AlSb and $In_xAl_{1-x}As_ySb_{1-y}$, and the channel layer is InAs. The semiconductor materials can be deposited on a suitable substrate, preferably GaAs, by molecular beam epitaxy in a conventional manner.

Figure 1:
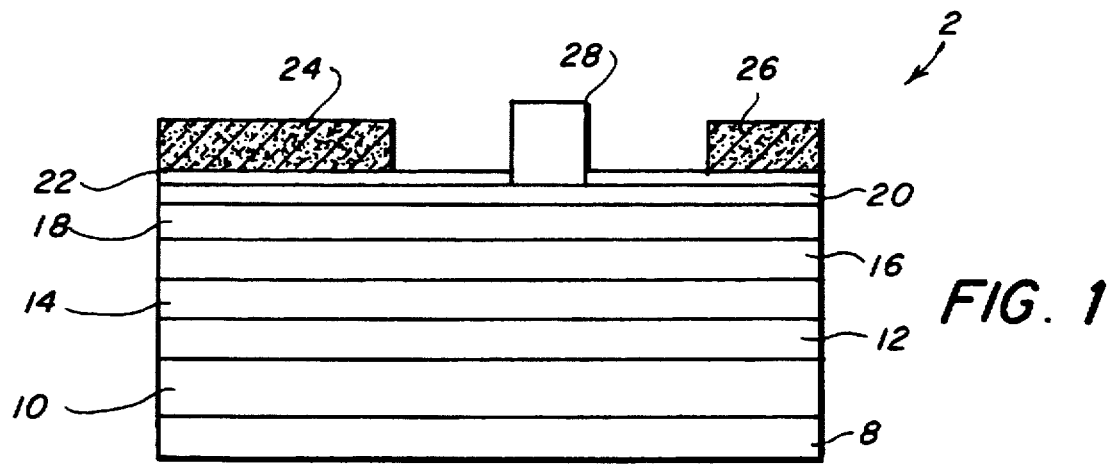
FIG. 1 is a cross-sectional view of a HEMT.

In an especially preferred embodiment, the electronic device 2 is a HEMT fabricated by depositing layers of semiconductor materials in sequence by means of molecular beam epitaxy. As shown in FIG. 1, the layers are deposited on a substrate from bottom up.

As shown in FIG. 1, substrate 8 is GaAs and the layers deposited thereon are as follows: layer 10 AlSb, p+ GaSb layer 12, AlSb layer 14, InAs layer 16, AlSb layer 18, $In_xAl_{1-x}As_ySb_{1-y}$ layer 20, and InAs layer 22. Source 24 and drain 26 metallizations were then formed on layer 22 and preferably heat treated to minimize contact resistance and thus form ohmic contacts. Gate 28 is disposed on layer 20.

Thickness of the various layers is as follows: AlSb layer 10 typically 0.1–10 microns, more typically 1–5 microns; that of p+ doped GaSb layer 12, typically 10–1000 Å, more typically 100–500 Å; AlSb layer 14, typically 50–5000 Å; more typically 100–2000 Å; InAs channel layer 16, typically 10–500 Å; more typically 50–300 Å; AlSb layer 18, typically 10–500 Å, more typically 50–300 Å; $In_xAl_{1-x}As_ySb_{1-y}$ layer 20, typically 10–500 Å, more typically 20–200 Å; and InAs cap layer 22, typically 5–200 Å, more typically 10–50 Å.

The source and drain contacts 24, 26 should be thick enough to provide a low contact resistance between the contacts and the semiconductor material. Heat treatment yields ohmic contacts with low contact resistance. Although any suitable contact material can be used, preferred is a contact containing a palladium layer in contact with layer 22 of the device 2, a barrier layer above the palladium layer, and gold layer above the barrier layer. The barrier layer can be platinum, titanium, titanium tungsten, platinum silicide, titanium carbide, tungsten carbide, or a mixture thereof. Preferred barrier material is platinum. Thickness of the contact layer before heat treatment is as follows: palladium layer, typically 10–1000 Å; more typically 50–500 Å; barrier layer, typically 50–1000 Å, more typically 100–500 Å; and gold layer, typically 100–5000 Å, more typically 200–2000 Å.

The heat treating step of the source and drain contacts 24, 26 is undertaken typically before gate formation to avoid thermal deterioration of the barrier material. The heat treating step is typically conducted above 150° for in excess of a few seconds, more typically above 170° for from a fraction of one hour and up to 10 hours. The gate metal 28 (Schottky gate), can be deposited in a known way by thermal or electron-beam evaporation.

Layers 10 and 14 are considered to be buffer layers, layer 16 is the narrow band gap channel, layer 18 and layer 20 form a wide band gap composite barrier layer, and layer 22 is the cap layer.

The fabrication of the device is conventional except isolation thereof. The process for fabricating a HEMT with a gate air bridge formed during the isolation etch is disclosed in Boos et al U.S. Pat. No. 5,364,816, which is incorporated herein by reference.

Figure 2:
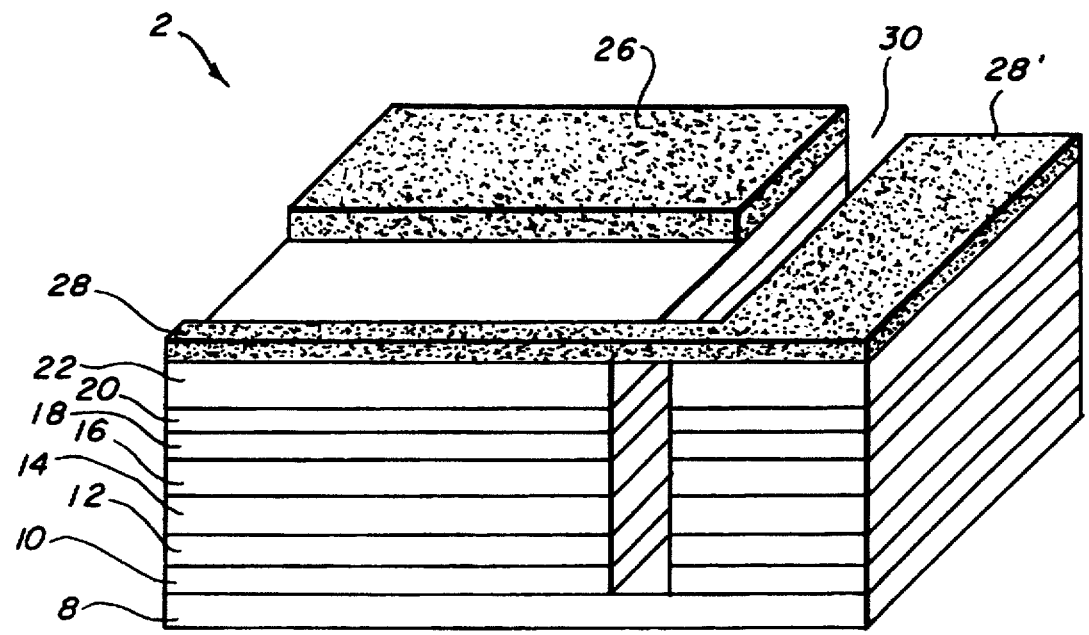
FIG. 2 is a perspective view of one-half of the electronic device of this invention showing the air bridge and isolation of the device characterized by the trench which forms the mesa edge.

The isolation process is characterized by the use of an etchant which etches trench 30, shown in FIG. 2, which isolates the device from the structure on which is disposed gate pad 28 and simultaneously forms a gate air bridge between gate pad 28 and device 2.

Before trench 30 is formed, the source, drain, and gate metallizations are provided on the device in conventional fashion. This is followed by patterning the device with a mesa photoresist pattern and then by a chemical etch to remove the semiconductor material from the cap layer 22 down to the substrate layer 8 to form trench 30.

The etchant used in the chemical etch contains lactic acid or acetic acid, hydrogen peroxide and hydrofluoric acid. In a preferred embodiment, lactic acid is used. Amount of lactic/or acetic acid is 15–35, typically 20–30, and especially about 25 volumes; amount of hydrogen peroxide is 1–10, typically 2–6, and especially about 4 volumes; and amount of hydrofluoric acid (HF) is 2–20, typically 6–15, and especially about 8 volumes.

The etch rates for this etchant can vary greatly depending on its composition. Hydrogen peroxide in the etchant is believed to oxidize the surface to be etched and hydrofluoric acid is believed to etch the oxidized layer. The etch rate varies directly with the relative amount of hydrogen peroxide in the etchant. Hydrofluoric acid is believed to have a lesser effect on etch rate than hydrogen peroxide. Depending on relative amount of the components in this etchant, the etch rate is typically in the range of 0.1–20, more typically 1–10, and especially 2–6 microns/10 seconds.

Three key features of the invention disclosed herein are the use of (1) an $In_xAl_{1-x}As_ySb_{1-y}$/AlSb barrier above the InAs quantum well or channel, (2) a $p^+$ GaSb layer located in the AlSb buffer layer below the InAs quantum well of the HEMT and (3) an isolation process sequence which allows for complete removal of the AlSb buffer layer material in the field and simultaneously forms a gate air bridge between the gate metal and the bonding pad to prevent contact between the channel and the gate metal at the mesa edge.

With respect to the first feature, the $In_xAl_{1-x}As_ySb_{1-y}$ barrier layer 20, in conjunction with the AlSb barrier layer 18, above the InAs channel 16 improves chemical stability and reduces the gate leakage current of the device. By adding layer 20, it is possible to perform a gate recess etch into the semiconductor layer 22 after gate lithography. In doing so, it is possible to achieve good electrical operation of the device using gate lengths down to 0.1 micron or lower.

In absence of layer 20, performing a gate recess and having the metal deposited directly on the AlSb layer 18 has thus far been unsuccessful because the AlSb layer is too reactive and therefore, the quality of the Schottky barrier gate on this material is poor. With the upper barrier layer 20, one has a more chemically stable surface onto which the gate metal, through layer 22, can be deposited to achieve a quality Schottky gate. The good properties of the heterojunction between layers 16 and 18 are maintained with the presence of layer 18.

Another reason for the upper barrier layer 20 is due to the band diagram in this material system. The AlSb-InAs heterojunction has a type II heterojunction band lineup. As a result, the HEMT structure has a large conduction band offset but a small valence band offset. As a result, there can be a significant gate leakage current associated with hole transport in the valence band because there is only a small energy barrier to holes with this heterojunction material. Therefore, upper barrier layer 20 provides additional valence band offset that the AlSb-InAs heterojunction does not have, and therefore, barrier layers are now present both in the conduction band and the valence band. By providing the upper barrier layer 20, the leakage current in the device disclosed herein was reduced by about an order of magnitude compared to the gate leakage current measured previously in a HEMT with comparable geometry but without the upper barrier layer 20.

With respect to the second feature pertaining to the addition of a $p^+$ GaSb layer located within the buffer layer, motivation for having this layer is the need to manage the holes generated by impact ionization in the structure. HEMTs which have channels with higher In content and therefore a narrower energy band gap are attractive because of their higher frequency of operation. However, with a narrow band gap channel, one has associated with that a significant amount of impact ionization in the device. Impact ionization generates electron-hole pairs. The electrons flow to the drain but the holes, which are positively charged, can become trapped and disrupt the charge control in the device, causing deleterious effects in the device operation. Therefore, the holes that are generated due to impact ionization, need to be effectively managed.

One of the problems observed in previous AlSb/InAs-based devices is that because there is only a small valence band barrier at the heterojunction between the channel and the buffer layer, the holes diffuse into the buffer layer and cause what is typically called a "kink effect." This is an opening of the channel as a result of the trapping of the additional holes in the buffer layer. One of the ways to reduce the kink effect is by using a $p^+$ GaSb layer 12 between the lower buffer layers 10 and 14 which drains the holes back to the source contact rather than having them become trapped in the buffer layer.

With respect to the third feature which pertains to the isolation process, when one fabricates a HEMT with a narrow band gap channel, a process is needed which does not allow the gate metal 28 to contact the narrow band gap channel 16 as it traverses the mesa edge of the device. A mesa is etched in the device to properly isolate the channel so that all the electrons flow between the source and the drain underneath the gate. The gate is prevented from contacting the narrow bandgap InAs channel 16 as it crosses the mesa edge in these devices by forming an air bridge so that the gate does not contact the InAs material at the mesa edge, as shown in FIG. 2. To accomplish this, the mesa etch, which typically occurs at the beginning of the fabrication process in most FETs, is moved to the end of the fabrication process.

Having described the invention, the following example is given as a particular embodiment thereof and to demonstrate the practice and advantages thereof. It is understood that the example is given by way of illustration and is not intended to limit the specification or the claims in any manner.

EXAMPLE 1

This example demonstrates preparation of HEMTs of this invention and certain advantages realized in conjunction with HEMTs provided with an upper composite barrier and a doped layer of GaSb.

Pursuant to the disclosure herein, layers of semiconductor materials were grown at 510° C. by molecular beam epitaxy on undoped (100) GaAs substrate 8. A 2.4 micron undoped AlSb layer 10 was grown first, followed by a 200 Å $p^-$ GaSb layer 12, a 500 Å undoped AlSb layer 14, a 100 Å undoped InAs channel layer 16, a 125 Å undoped AlSb layer 18, a 40 Å $In_{0.4}Al_{0.6}As$ layer 20 with mole fraction of Sb at zero, and finally a 15 Å undoped InAs cap layer 22.

The 2.4 micron thick AlSb buffer layer 10 served to accommodate the 7% lattice mismatch between the HEMT material and the GaAs substrate 8. Modulation doping of the InAs channel layer 16 (quantum well) was obtained through the use of an As overpressure soak which was performed between the growth of the AlSb barrier layer 18 and the $In_{0.4}Al_{0.6}As$ barrier layer 20. For the As soak, a monolayer of Al was deposited and the Al-rich surface was then soaked in an As beam for 10 seconds. The sheet carrier density and mobility of the starting material, determined by Hall measurement at 300K were $1.5 \times 10^{22}/cm^2$ and 16,600 $cm^2$/V-s.

The HEMTs were fabricated using standard photolithographic and liftoff techniques. The source-drain contact patterns were defined using a PMMA resist and deep UV lithography. Pd/Pt/Au (100 Å/200 Å/600 Å) source and drain contact metallizations were then formed using e-beam evaporation, acetone liftoff, and heat treatment at 175° C. using a hot plate which was located within a glove box containing a $H_2:N_2$ (5%:95%) ambient gas. The unfinished device was heat treated for 3 hours to ensure sufficient reaction of the Pd. The Schottky gate contact was Cr/Au formed using tri-level resist e-beam lithography. Device isolation was achieved by wet chemical etching and to reduce leakage current, a gate air bridge was formed at the mesa edge.

Figure 3:
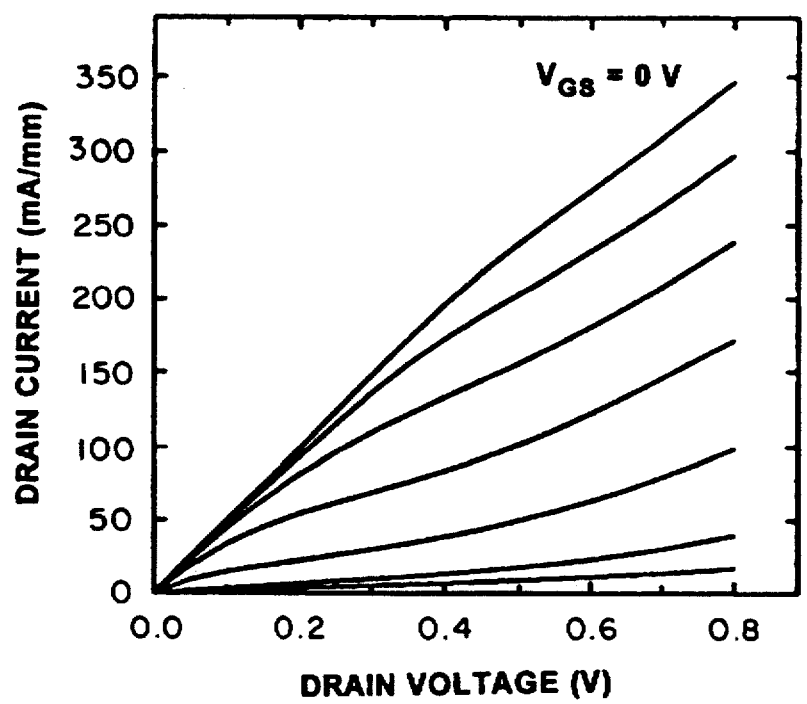
FIG. 3 is a graph of drain current vs. drain voltage of the HEMTs of Ex. 1.
Figure 4:
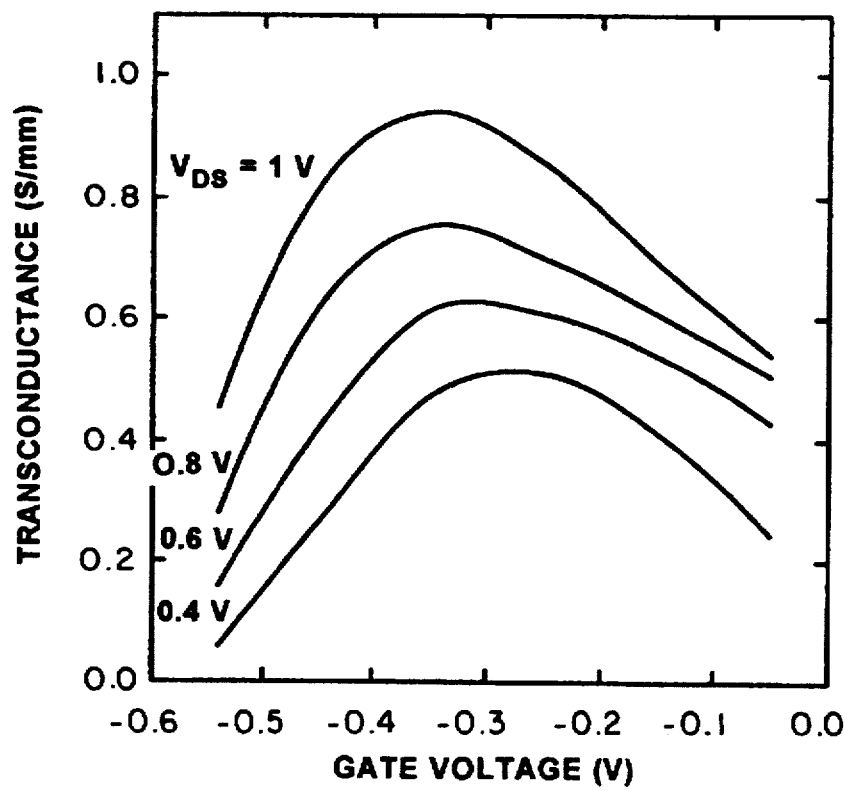
FIG. 4 is a graph of transconductance vs. gate voltage for the HEMTs of Ex. 1.
Figure 5:
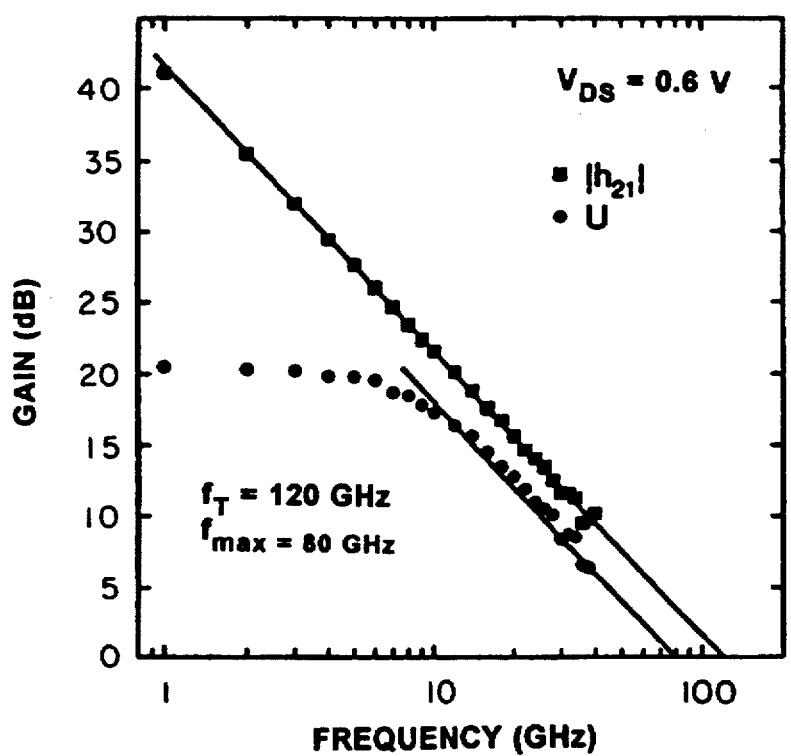
FIG. 5 is a graph of current gain vs. frequency for the HEMTs of Ex.1.
Figure 6:
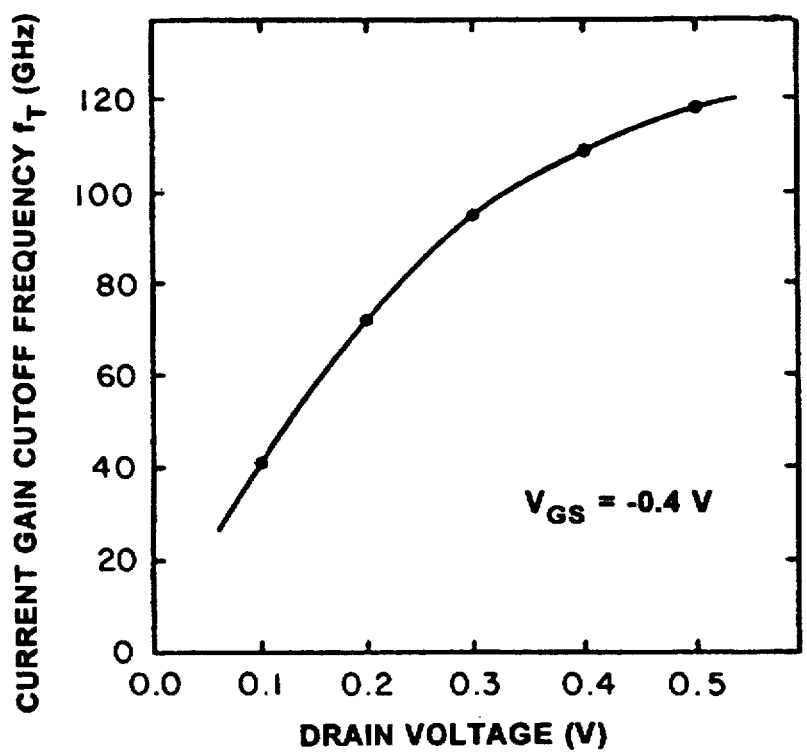
FIG. 6 is a graph of current gain cutoff frequency vs. drain voltage for the HEMTs of Ex. 1.

With respect to 0.1 μm gate length AlSb/InAs-based HEMTs, which were fabricated for the first time, the drain characteristics are shown in FIG. 3. The HEMTs had a threshold voltage of −0.5V and a low field source-drain resistance of 2.0 Ω-mm at $V_{GS}$=0 V. A transconductance of over 700 mS/mm at $V_{DS}$=0.8 V was obtained, as shown in FIG. 4. As mentioned earlier, the gate leakage current due to holes generated by impact ionization was observed to be reduced by more than an order of magnitude compared to previous devices. Using S-parameter measurements from 1 to 40 GHz and equivalent circuit modeling, a transconductance of over 700 mS/mm and a voltage gain of 4 was obtained at 1 GHz, indicating minimal $g_m$ dispersion. The HEMTs exhibited a measured $f_T$ of 120 GHz. A plot of the short circuit current gain, $|h_{21}|$, and unilateral gain, U, as a function of frequency, is shown in FIG. 5. After subtraction of the gate bonding pad capacitance, an $f_T$ above 150 GHz was obtained. The maximum available power gain, $f_{max}$, at $V_{DS}$=0.6 V was measured to be 80 GHz.

HEMTs with a gate length of 0.2 μm, which were also fabricated on the same slice, exhibited an $f_T L_g$ product of over 30 GHz-μm. AlSb/InAs HEMTs with a gate length of 0.5 μm gate length, fabricated on the same slice, exhibited an $f_T L_g$ product of 50 GHz-μm. The $f_T L_g$ product is a commonly-used figure of merit which characterizes the inherent speed of a HEMT.

The inherent low-voltage performance of the HEMTs has also been demonstrated. The potential for low voltage operation is shown in FIG. 4, which shows the measured $f_T$ as a function of drain voltage. The maximum $f_T$ occurs at a drain voltage of near 0.5 V. The gate leakage current at this bias condition was near 1 μA. At a drain voltage of 200 mV, an $f_T$ of 65 GHz was obtained.

While presently preferred embodiments have been shown of the invention disclosed herein, persons skilled in this art will readily appreciate that various additional changes and modifications can be made without departing from the spirit of the invention as defined and differentiated by the following claims.

What is claimed is:

1. An electronic device comprising a first layer of a semiconducting material, a second layer of a semiconducting material, a third layer of a semiconducting material, and Schottky gate in contact with said third layer; said third layer is of a wider band gap than said first layer, said second layer is an AlSb-based material and is disposed between and is in contact with said first and said third layers.

2. The device of claim 1 wherein said first layer is InAs and said third layer is $In_xAl_{1-x}As_ySb_{1-y}$ wherein said third layer contains at least some In, Al and As.

3. The device of claim 2 wherein thickness of the layers is as follows: said first layer, 50–300 Å; said second layer, 50–300 Å; and said third layer, 20–200 Å.

4. The device of claim 3 including a fourth layer in contact with said third layer and at least one ohmic contact in contact with said fourth layer.

5. The device of claim 4 wherein said fourth layer is 10–50 Å thick InAs and said ohmic contact is Pd/barrier/Au.

6. The device of claim 5 wherein in said ohmic contact thickness is as follows: palladium layer, 50–500 Å; barrier layer, 100–500 Å; and gold layer, 200–2000 Å; and said barrier in said ohmic contact is selected from the group consisting of platinum, titanium, titanium tungsten, platinum silicide, titanium carbide, titanium silicide, and mixtures thereof.

7. The device of claim 5 including a buffer layer below said first layer, a doped layer within said buffer layer, and a substrate below said buffer layer.

8. The device of claim 7 wherein said buffer layer is AlSb, said doped layer is $p^+$ GaSb, and said substrate is GaAs.

9. The device of claim 8 wherein said buffer layer is 1–5 microns thick and said doped layer is 100–500 Å thick and is doped with silicon atoms.

10. An electronic device comprising the following layers disposed on a GaAs substrate: a first AlSb layer disposed on said substrate; $p^+$ GaSb layer disposed on said first AlSb layer; a second AlSb layer disposed on said $p^+$ GaSb layer; an InAs channel layer disposed on the said second AlSb layer; a third AlSb layer disposed on said InAs channel layer; an $In_xAl_{1-x}As_ySb_{1-y}$ layer containing at least In, Al and As disposed on said third AlSb layer; an InAs cap layer disposed on said $In_xAl_{1-x}As_ySb_{1-y}$ layer; two ohmic contacts disposed on said InAs cap layer; and a Schottky gate disposed between the ohmic contacts and being in contact with said $In_xAl_{1-x}As_ySb_{1-y}$ layer.

11. The device of claim 10 wherein the various thicknesses are as follows: said first AlSb layer, 2.4 microns: said $p^+$ GaSb layer, 200 Å; said second AlSb layer, 500 Å; said InAs channel layer, 100 Å; said third AlSb layer, 125 Å; said $In_xAl_{1-x}As_ySb_{1-y}$ layer, 40 Å; and said InAs cap layer, 15 Å.

12. The device of claim 11 wherein each of said two ohmic contacts is Pd/Pt/Au having respective thickness of 100 Å, 200 Å, and 600 Å; and said Schottky gate is Cr/Au.

* * * * *